United States Patent [19]

Ohmi et al.

[11] Patent Number: 5,605,742
[45] Date of Patent: Feb. 25, 1997

[54] METAL MATERIAL FORMED WITH FLUOROCARBON FILM, PROCESS FOR PREPARING THE MATERIAL AND APPARATUS MADE WITH USE OF THE MATERIAL

[75] Inventors: Tadahiro Ohmi, Sendai; Kazuo Chiba, Mishima; Hideo Kume, Numazu; Yutaka Mikasa, Mishima; Matagoro Maeno; Yoshinori Nakagawa, both of Izumi; Hiroto Izumi, Sendai; Kazuhito Yamane, Sakai, all of Japan

[73] Assignees: Hashimoto Chemical Co. Ltd., Osaka-fu; Mitsubishi Aluminum Co., Ltd., Tokyo, both of Japan

[21] Appl. No.: 534,985

[22] Filed: Sep. 27, 1995

[30] Foreign Application Priority Data

Oct. 28, 1994 [JP] Japan ................................ 6-288805

[51] Int. Cl.$^6$ .................................................. B32B 9/00
[52] U.S. Cl. ......................... 428/216; 128/408; 128/469; 128/457; 128/704
[58] Field of Search ................................ 428/408, 469, 428/457, 216, 704

[56] References Cited

U.S. PATENT DOCUMENTS

| | | | |
|---|---|---|---|
| 4,693,927 | 9/1987 | Nishikawa et al. | 428/216 |
| 4,770,940 | 9/1988 | Ovshinsky et al. | 428/408 |
| 5,009,963 | 4/1991 | Ohmi et al. | 428/469 |
| 5,352,917 | 10/1994 | Ohmi | 257/410 |

*Primary Examiner*—Archene Turner
*Attorney, Agent, or Firm*—Nikaido, Marmelstein, Murray & Oram LLP

[57] ABSTRACT

A metal material characterized in that the material comprises a substrate metal, a film comprising a nickel fluoride layer and formed on the substrate metal, and a film comprising a carbon layer and formed on the film.

3 Claims, 12 Drawing Sheets

METAL MATERIAL FORMED WITH FLUOROCARBON FILM, PROCESS FOR PREPARING THE MATERIAL AND APPARATUS MADE WITH USE OF THE MATERIAL

BACKGROUND OF THE INVENTION

1. Field of the invention

The present invention relates to metal materials comprising a metal and at least a fluorocarbon layer formed on the surface of the metal, and solid surface treating apparatus, processing apparatus and parts fabricated or prepared with use of such a metal material. More particularly, the invention relates to metal materials suitable for use in semiconductor production apparatus, gas supply piping systems, chemical liquid supply piping systems and the like of which a high degree of cleanliness is required.

2. Prior Art

Conventionally, Teflon (polytetrafluoroethylene) and like resin materials having corrosion resistance are generally used for apparatus for supplying ulrapure water or chemical liquids or for conducting treatments such as cleaning with use of the water or liquid. However, the resin materials have the problem of being less hard and more liable to break than metals. Teflon and like resin materials have another problem in that since they are permeable to chemical vapors, the chemical vapor passing through the material will cause corrosion to instruments and exposed metal parts.

SUMMARY OF THE INVENTION the main object of the present invention is to provide a metal material which comprises a metal and a carbon film and/or a fluorocarbon film formed over the surface of the metal and which has satisfactory corrosion resistance to corrosive gases, such as speciality gas, and to chemical liquids, and to provide apparatus fabricated with use of the metal material.

the above object is fulfilled by forming a carbon film and/or a fluorocarbon film over the surface of metal to obtain metal material, and by using the metal material having the fluorocarbon film for at least part of apparatus, piping systems, etc.

DETAILED DESCRIPTION OF THE INVENTIOIN

Figure 1:
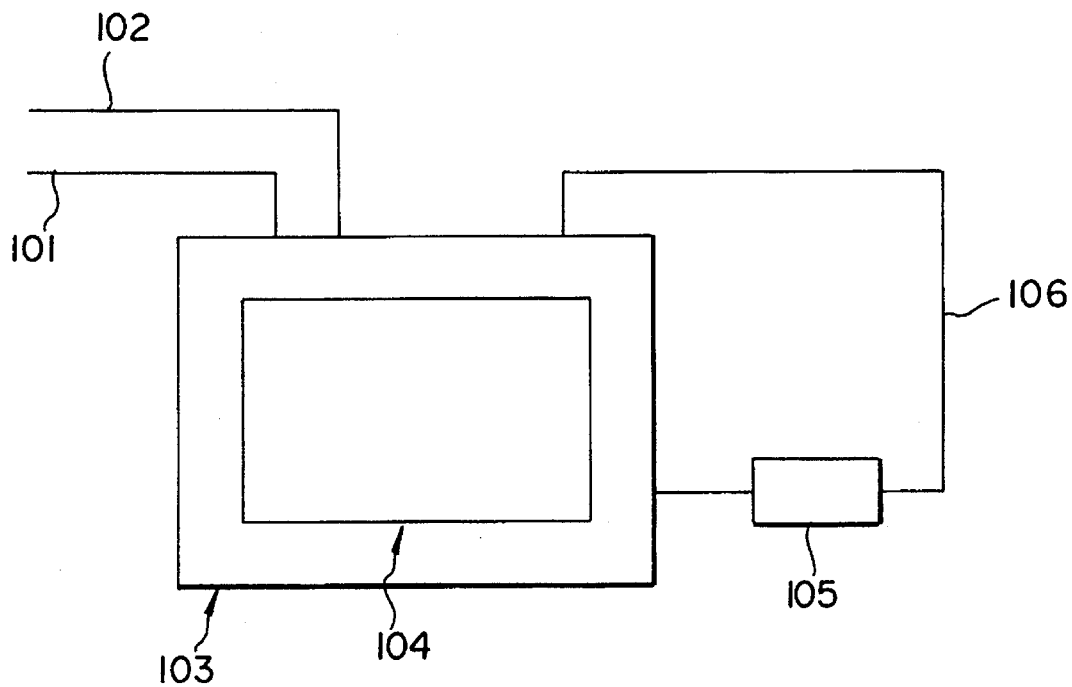
FIG. 1 is an diagram of an example of chemical liquids apparatus.

According to the present invention, the surface of a metal material to be exposed to a chemical liquid is formed with at least a carbon and/or fluorocarbon film. Use of the material prevents apparatus and parts from corrosion due to the chemical liquid, and also precludes the chemical liquid from contamination. the metal material is formed with the carbon and/or fluorocarbon film and is therefore less susceptible to damage or breakage than resin materials.

The metal materials provided by the present invention are divided into four general groups.

(a) Those having a nickel fluoride layer formed on a substrate metal and a carbon layer formed on the layer.

(b) Those having a nickel fluoride layer formed on a substrate metal, a carbon layer formed on the fluoride layer and a fluorocarbon layer formed on the carbon layer.

(c) Those having a carbon layer formed on a substrate metal and a fluorocarbon layer formed on the layer.

(d) Those having a carbon layer formed on a substrate metal.

The metal material (a) has a nickel fluoride layer and a carbon layer on the fluoride layer and is therefore characterized by improved water repellency, reduced frictional resistance, and corrosion resistance imparted by the nickel fluoride layer on the substrate metal. The thickness of the nickel fluoride is 100 angstroms to 1 micrometer, preferably 1000 angstroms to 2000 angstroms. The carbon layer is 10 angstroms to 1 micrometer, preferably 1000 angstroms to 5000 angstroms, in thickness.

The metal material (b) corresponds to the metal materials (a) which is further formed with a fluorocarbon layer. The fluorocarbon layer gives the material remarkably improved corrosion resistance. The material has the additional feature of exhibiting high corrosion resistance in a severe corrosive atmosphere. The fluorocarbon layer has a thickness of 10 angstroms to 5000 angstroms, preferably of 50 angstroms to 1000 angstroms.

The metal material (c) has a carbon layer formed first on a substrate metal and a fluorocarbon layer formed on the carbon layer. Since the carbon layer is formed directly on the substrate metal and covered with the fluorocarbon layer, the metal material has sufficient corrosion resistance and is advantageous in that the films can be formed more easily than in the case of the material (a) or (b). More specifically, there is no need to cause a nickel fluoride film to remain on the substrate metal in the step of forming the carbon layer. The carbon layer and the fluorocarbon layer of the material are the same as those of the materials (a) and (b) in thickness.

The metal material (d) has a single carbon layer only a substrate metal. Accordingly, the material is the most simple of all the metal materials (a) to (b) in the film forming process, and has the feature of being inexpensive to prepare for use under conditions necessitating low corrosion resistance and low frictional resistance. The thickness of the carbon layer of the material is 10 angstroms to 1 micrometer, preferably 1000 angstroms to 5000 angstroms.

The four metal materials of the present invention described have the distinct feature being outstanding in corrosion resistance, and can be used for fabricating various apparatus with this feature taken advantage of.

Various metals are usable as substrate metals according to the invention. Especially useful are stainless steel, nickel, aluminum and alloys of such a metal and other metal. Also useful are these metals as plated with semi-metals containing nickel, for example, as covered with a nickel-phosphorus plating.

According to the invention, the metal material is fluorinated to obtain a surface formed by nickel fluoride, which is then brought into contact with a hydrocarbon gas for reaction to deposit carbon by the replacement of fluorine by carbon (to be referred to as "carbon treatment"). Depending on the reaction condition, the nickel fluorine film can be allowed to remain, or the fluorine is entirely replaceable by carbon.

Figure 4:
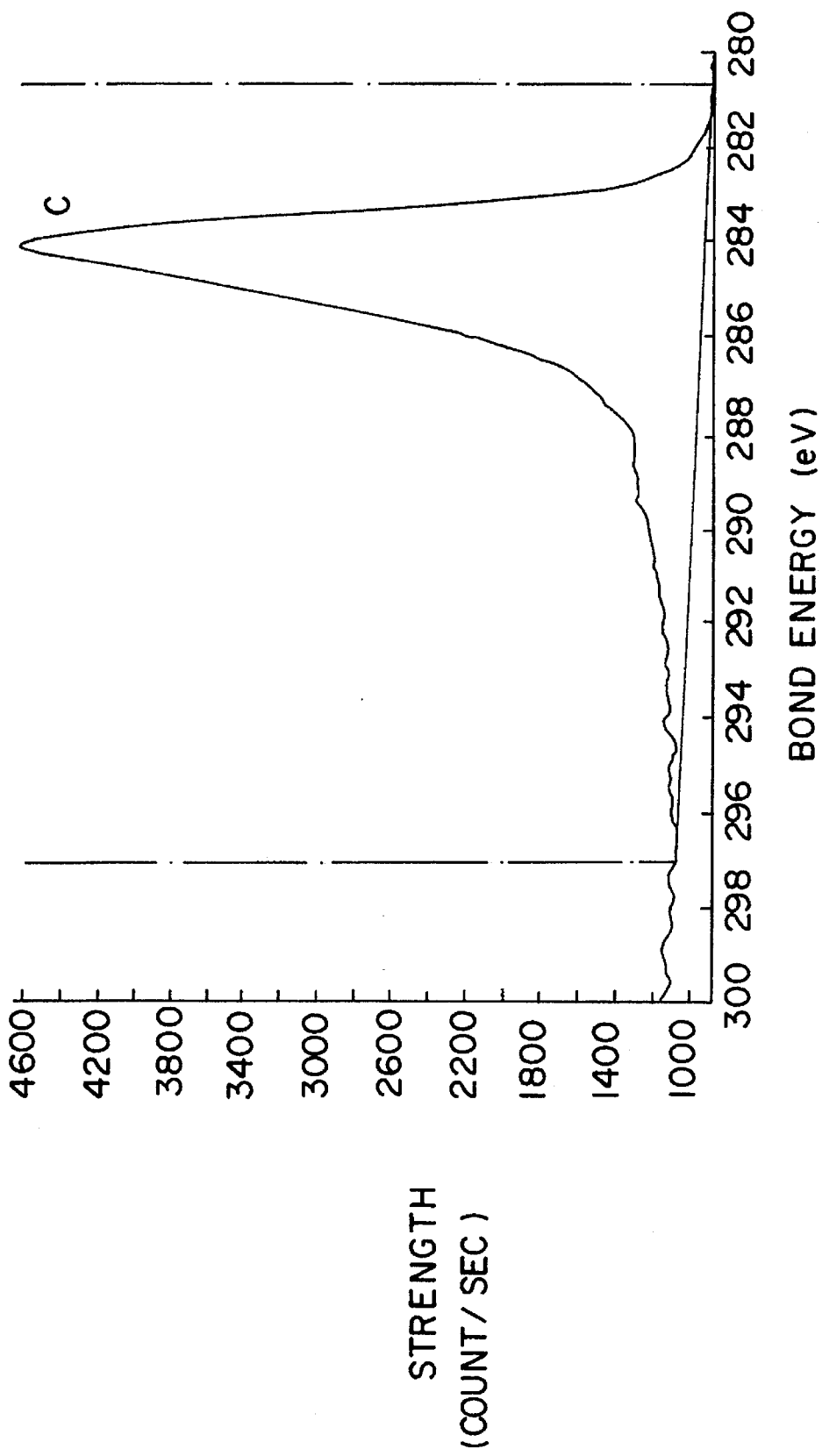
FIG. 4 is an ESCA depth chart of a carbon layer formed on a substrate metal.

The carbon treatment with the hydrocarbon is conducted at room temperature to 400° C., preferably at a temperature of 200° to 370° C., for 1 to 5 hours. Preferably, the hydrocarbon gas is used singly or as diluted with a suitable inert gas such as $N_2$, Ar or He, as the atmosphere for the carbon treatment. FIG. 4 shows the result of ESCA measurement of the surface formed by the treatment. C—C bonds were found, indicating that a carbon layer was formed over the surface.

According to the present invention, the carbon treatment is followed by fluorination (to be referred to as "fluorocarbon treatment") as the case may be. The fluorocarbon treatment is conducted at room temperature to 300° C., preferably at a temperature of 100° to 250° C. The state of binding of carbon and fluorine in the surface was checked by ESCA with the results shown in FIGS. 7 and 8. CF bonds are found at room temperature due to adsorption of fluorine, and with a rise in the fluorination temperature, $CF_2$ and $CF_3$ bonds occur with increasing proportion of bonds formed with greater carbon valences. The thickness of fluorocarbon film also increases with the temperature as listed in Table 2. The carbon layer disappears owing to the formation of $CF_4$ when fluorination is conducted at 305° C.

The fluorocarbon treatment is conducted for several minutes to 5 hours. The fluorocarbon treatment is carried out preferably in an oxygen-free atmosphere. It is therefore desirable to use fluorine singly or as diluted with a suitable inert gas such as $N_2$, Ar or He. The fluorocarbon treatment is conducted basically at atmospheric pressure but can be carried out with application of pressure when so desired. The pressure to be applied is up to about 2 atm. in gauge pressure.

It is desired that the resulting material be further heat-treated in an inert gas such as $N_2$, Ar or He. The heat treatment is conducted at 100° to 400° C., preferably 200° to 370° C., for 1 to 5 hours, whereby a fluorocarbon film is formed which is tough, compact, satisfactory in adhesion to the metal and further sufficient in corrosion resistance.

Apparatus of the present invention will be described next.

The apparatus of the present invention are fabricated with use of the metal material formed with the fluorocarbon film described for the portion thereof to be brought into contact with a chemical liquid or corrosive gas. The material having the fluorocarbon film is of course usable also for other portions not to be exposed to such a liquid or gas.

The term "chemical liquid apparatus" is used in a broad sense including all the apparatus that handle chemical liquids. Examples of such apparatus are those for storing or transporting chemical liquids, reactors wherein chemical liquids are used or mixed, etc. More specific examples are thanks, pipes or piping, valves, pumps, containers, cleaning devices, etc.

The term "gas apparatus" is used in a broad sense including all the apparatus for handling gases. Examples of such apparatus are those for storing or transporting gases, reactors wherein a gas is used or produced, etc. More specific examples are gas cylinders, gas holders, pipes or piping, valves, RIE reactors, CVD reactors, etc.

FIG. 1 is a diagram showing an example of chemical liquid apparatus. The apparatus comprises a chemical liquid mixing tank 103, chemical liquid supply pipes 101, 102, a chemical liquid recycling pump 105 and a chemical liquid recycling pipe 106. A fluorocarbon film 104 is formed over the inner wall of the tank 103. The fluorocarbon film is formed on the inner wall of stainless steel of the tank 103 by forming a nickel-phosphorus plating, 10 micrometers in thickness, on the inner wall by electroless plating, removing an oxide film from the surface with 0.5% aqueous solution of HF, removing water from the resulting surface by baking in a nitrogen atmosphere at 250° C. for 10 hours, followed by fluorination in 100% fluorine at 350° C. for 6 hours and further by a heat-treatment in a nitrogen atmosphere at 300° C. for 2 hours. The film thus formed is an $NiF_2$ film having a thickness of 1500 angstroms.

Next, 10% cyclopropane diluted with nitrogen is brought into contact with the $NiF_2$ surface at 350° C. for 2 hours to form carbon to a thickness of 2000 angstroms, followed by fluorination in 100% fluorine at 100° C. for 1 hour and finally by heat-treatment in a nitrogen atmosphere at 300° C. for 2 hours to form a fluorocarbon film, 100 angstroms in thickness, over the carbon.

Figure 2:
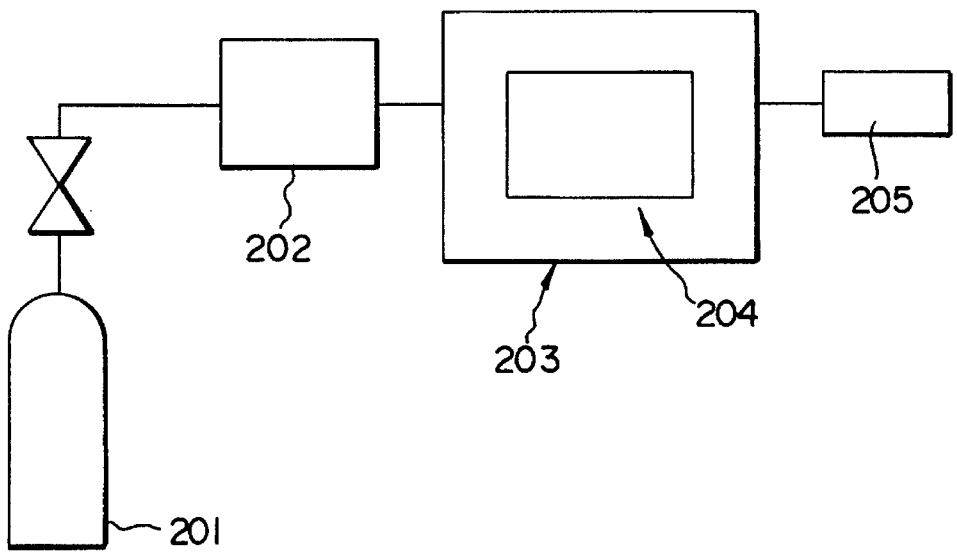
FIG. 2 is a diagram of an example of gas apparatus.

FIG. 2 is a diagram showing an example of gas apparatus. The apparatus comprises a gas storage cylinder 201, a gas supply system 202 incorporating a valve, mass flow controller, etc., a reactor 203 comprising an RIE device or CVD device, and an evacuating device 205. The reactor 203 has a chamber inner wall formed with a fluorocarbon film 204. The fluorocarbon film is formed on the reactor inner wall of aluminum by forming a nickel- phosphorus plating, 10 micrometers in thickness, on the wall by electroless plating, removing an oxide film from the surface with 0.5% aqueous solution of HF, removing water from the resulting surface by baking in a nitrogen atmosphere at 250° C. for 10 hours, followed by fluorination in 100% fluorine at 350° C. for 6 hours and further by a heat-treatment in a nitrogen atmosphere at 300° C. for 2 hours. The film thus formed is an $NiF_2$ film having thickness of 1500 angstroms. Next, 10% cyclopropane diluted with nitrogen is brought into contact with the $NiF_2$ surface at 300° C. for 2 hours to form carbon to a thickness of 1500 angstroms, followed by fluorination in 100% fluorine at 150° C. for 1 hour and finally by a heat-treatment in a nitrogen atmosphere at 300° C. for 2 hours to form a fluorocarbon film, 230 angstroms in thickness, over the carbon.

EXAMPLES

For a better understanding of the technical disclosure of the invention, typical examples are selectively given below.

Reference Example 1

A nickel fluoride film was formed on a sample comprising an aluminum substrate and a nickel-phosphorus plating formed thereon. First, the sample was etched with a 0.5% aqueous solution of HF to remove a spontaneous oxide film from the surface. To remove water from the resulting surface, the sample was baked in a nitrogen atmosphere at 250° C. for 10 hours, followed by fluorination in 100% $F_2$ at 350° C. for 6 hours and further by a heat-treatment in a nitrogen atmosphere at 300° C. for 2 hours, whereby the nickel fluoride film was formed.

Figure 3:
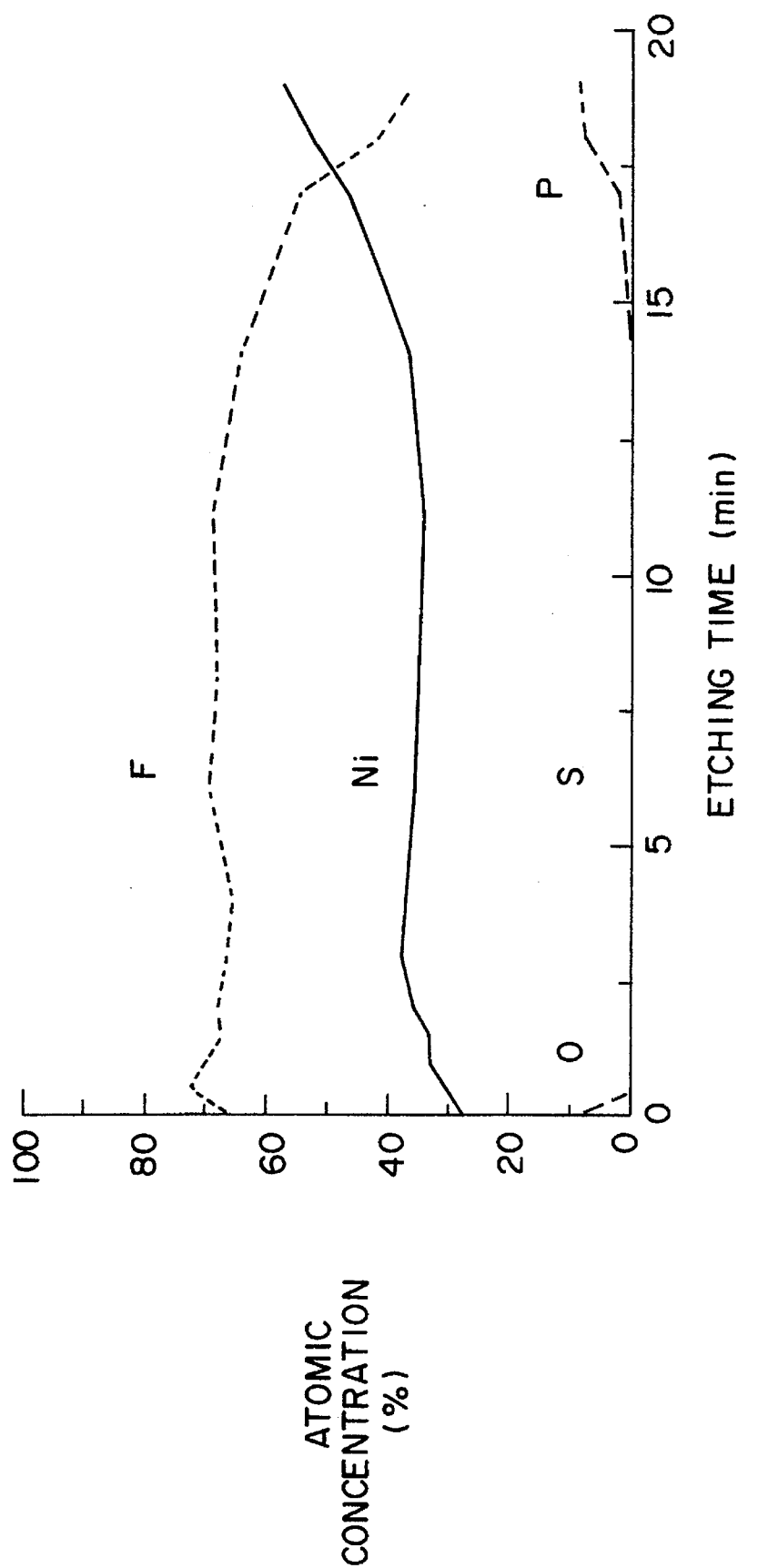
FIG. 3 is an ESCA depth chart of a fluoride film formed on a substrate metal.

FIG. 3 is an ESCA depth chart of the fluoride film thus obtained. The phosphorus present in the nickel-phosphorus plating of the sample reached with fluorine and egressed from the nickel fluoride film in the form of $PF_3$, so that the fluoride film was free of phosphorus and was formed as a single-layer film having a thickness of 0.2 micrometer.

Example 1

Samples having nickel fluoride on the surface (the same as the sample of Reference Example 1) were reacted with propane gas at varying temperatures listed in Table 1 for 2 hours to form carbon films. The thickness of the carbon layers obtained at the different temperatures of carbon treatment was measured by ESCA with the result given in Table 1.

The film formed by the carbon treatment at 405° C. became separated.

TABLE 1

| Carbon film forming temperature (°C.) | 200 | 250 | 300 | 350 | 405 |
|---|---|---|---|---|---|
| Film thickness (angstroms) | 500 | 900 | 1500 | 2000 | 10000 |

FIG. 4 is a narrow chart of carbon on the outermost surface of the carbon film formed at 350° C. as determined by ESCA, revealing C—C bonds but no C—F bonds.

Example 2

Figure 5:
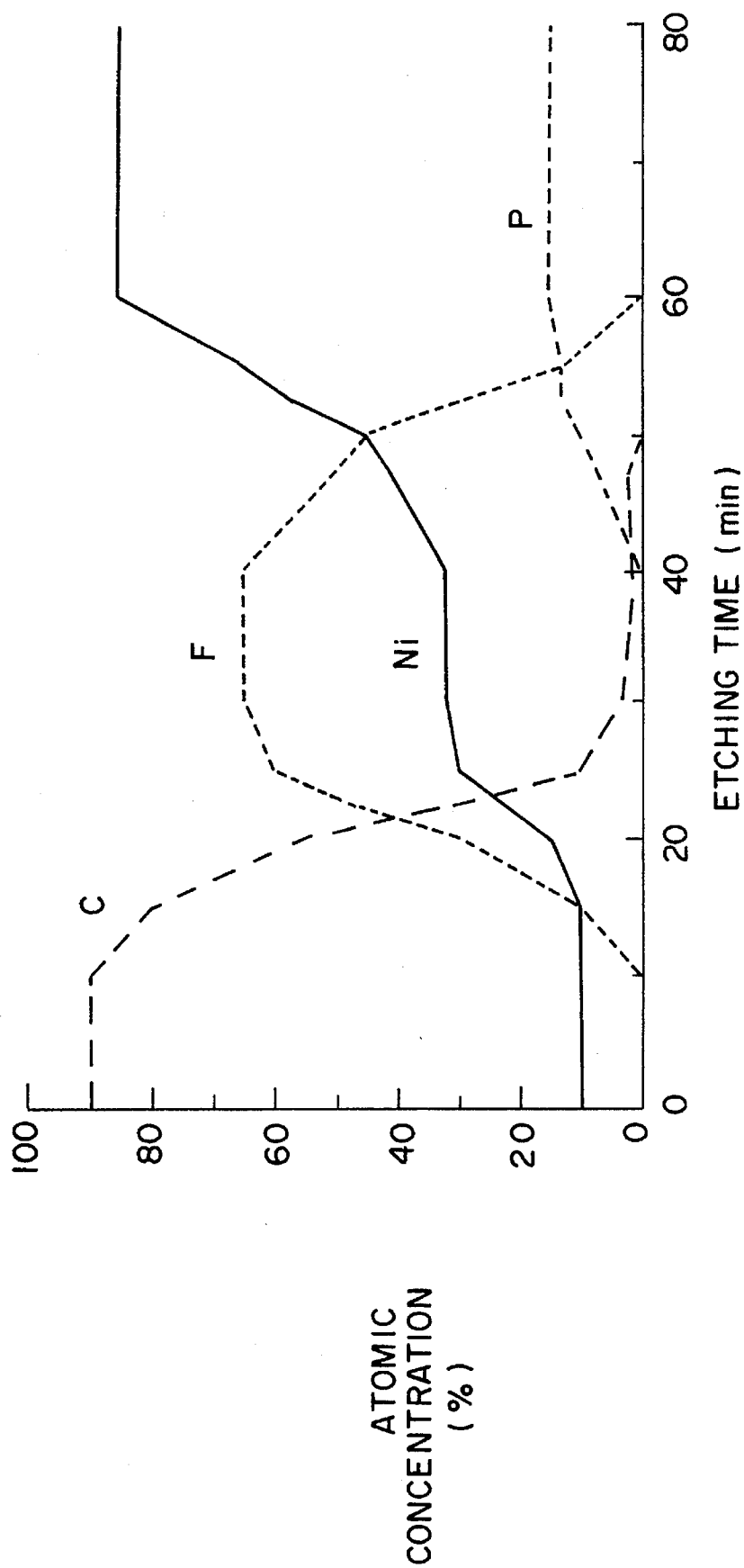
FIG. 5 is an ESCA depth chart of a material of Example 2.
Figure 6:
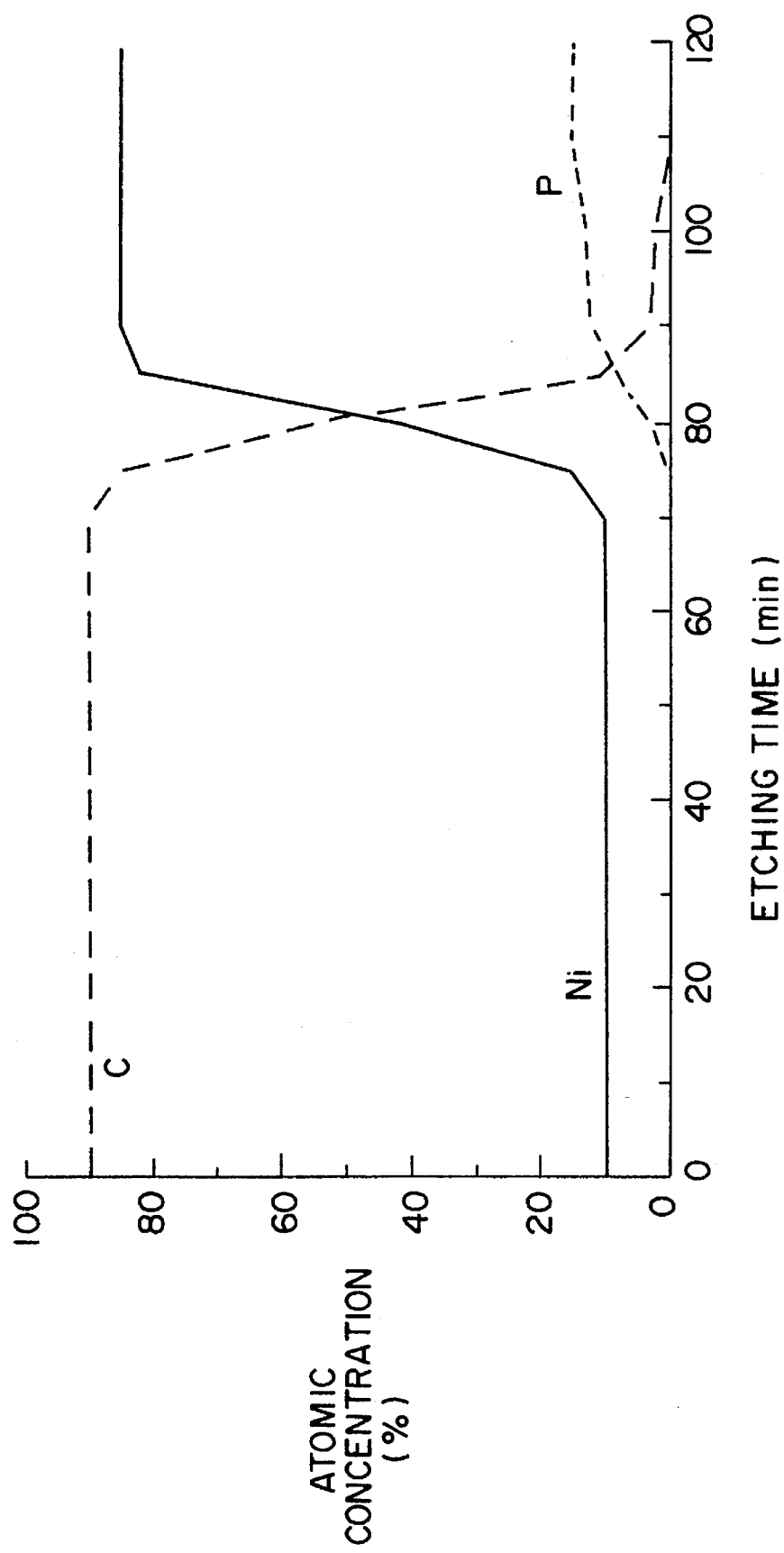
FIG. 6 is an ESCA depth chart of a material of Example 2.

Samples having nickel fluoride on the surface (the same as the sample of Reference Example 1) were subjected to a carbon treatment with propane gas at 350° C. for 1 hour or 5 hours. FIGS. 5 and 6 show depth charts obtained by ESCA measurement. When the treating time was lengthened, the $NiF_2$ layer disappeared with formation of a thick carbon layer.

Example 3

Samples having a carbon deposit (those subjected to the carbon treatment with propane gas at 350° C. for 1 hour in Example 2) were fluorinated in 100% fluorine gas for 1 hour at varying temperatures shown in Table 2, and thereafter heat-treated in an inert gas at 350° C. for 2 hours. The fluorocarbon films obtained by the fluorination at the different temperatures were checked for thickness. Table 2 shows the result.

The carbon film disappeared from the surface of the sample fluorinated at 305° C. owing to the formation of $CF_4$.

TABLE 2

| Film forming temperature (°C.) | 100 | 150 | 200 | 250 | 305 |
|---|---|---|---|---|---|
| Film thickness (angstroms) | 100 | 230 | 670 | 1000 | 720 |

Figure 7:
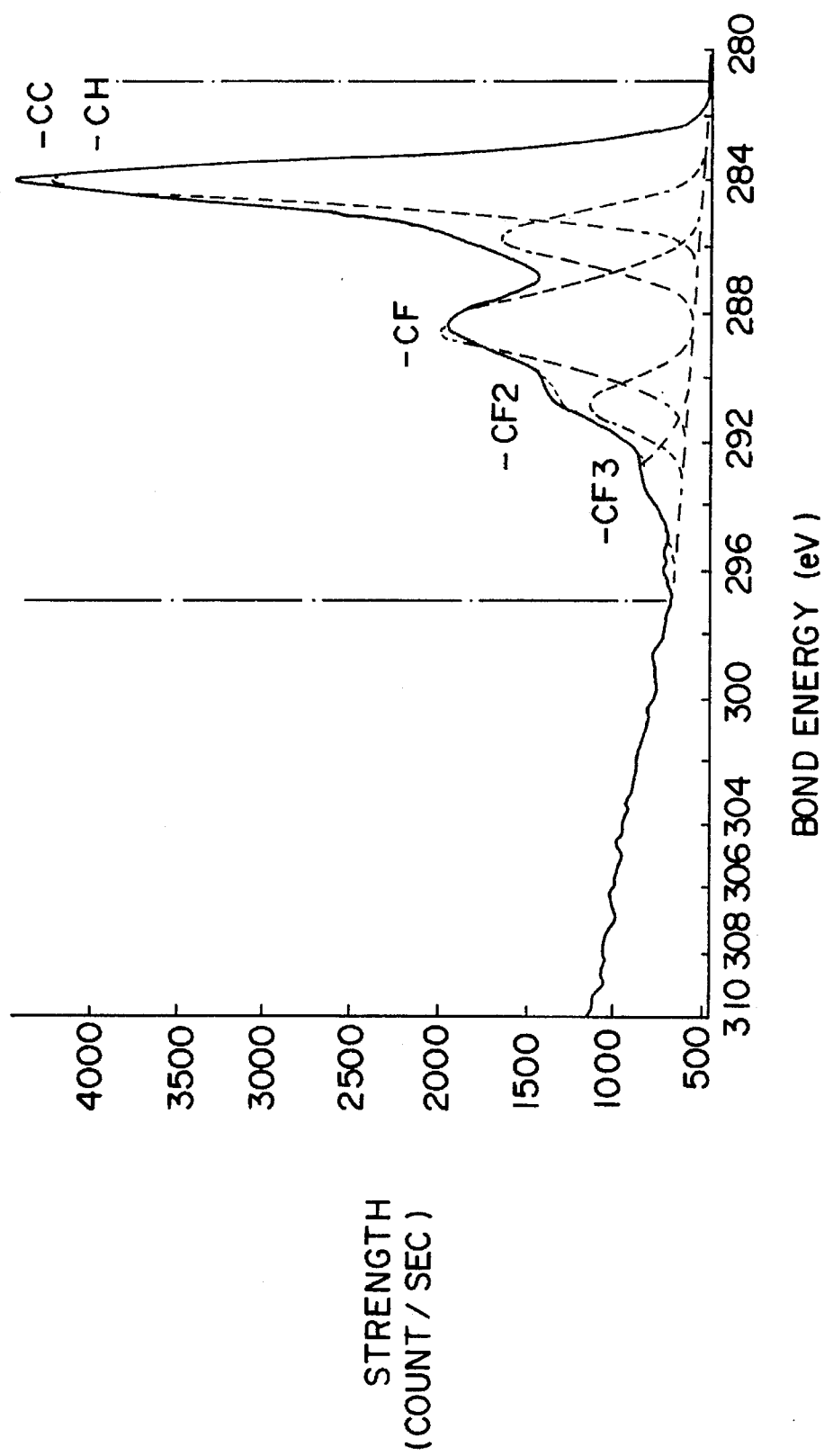
FIG. 7 is an ESCA depth chart of a material of Example 3.
Figure 8:
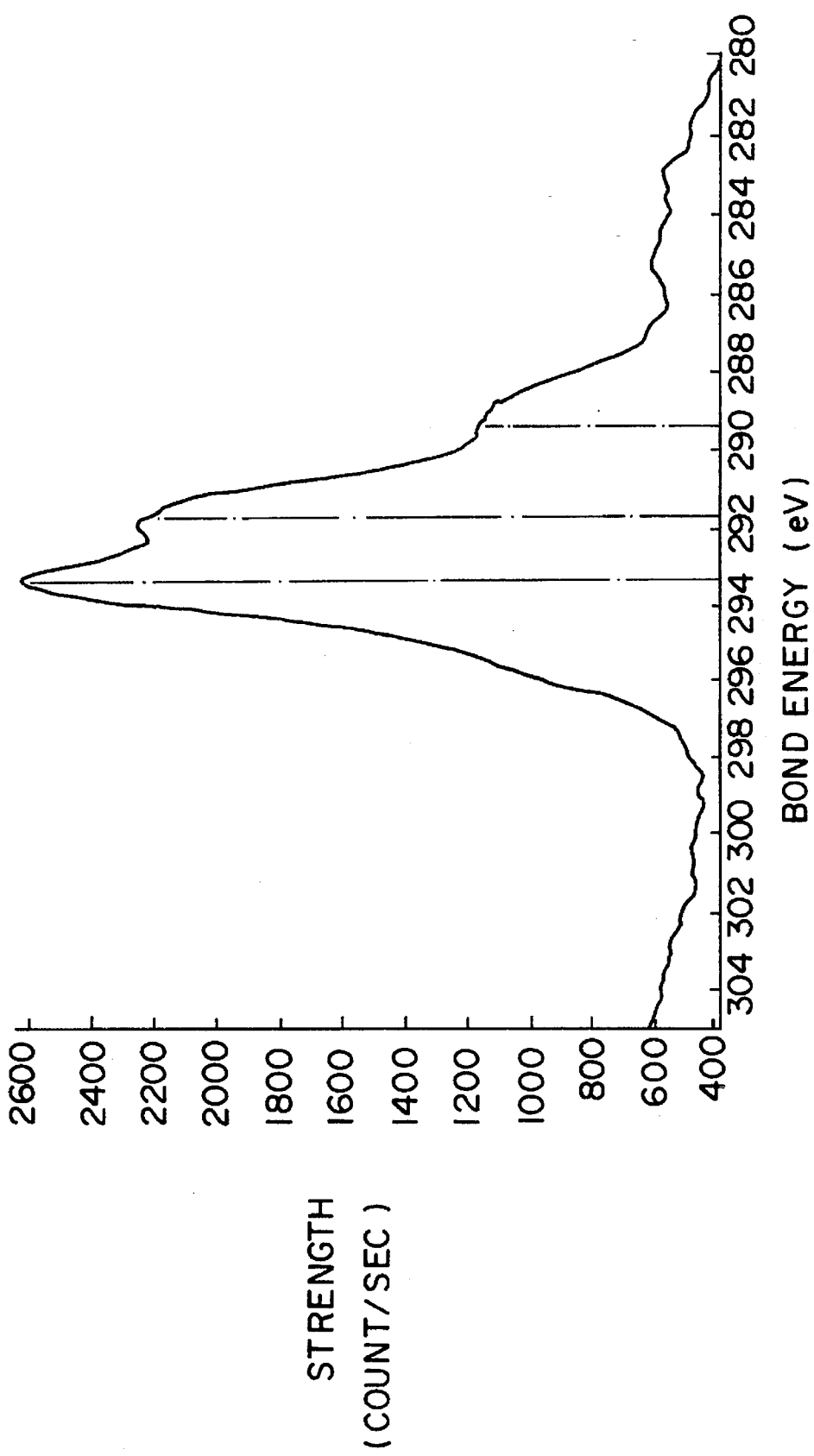
FIG. 8 is an ESCA depth chart of a material of Example 3.

FIGS. 7 and 8 are narrow charts of carbon on the outermost surfaces of the films formed at 100° C. and 200° C., respectively, as obtained by ESCA. CF, $CF_2$ and $CF_3$ bonds were formed at 100° C.

Example 4

Figure 9:
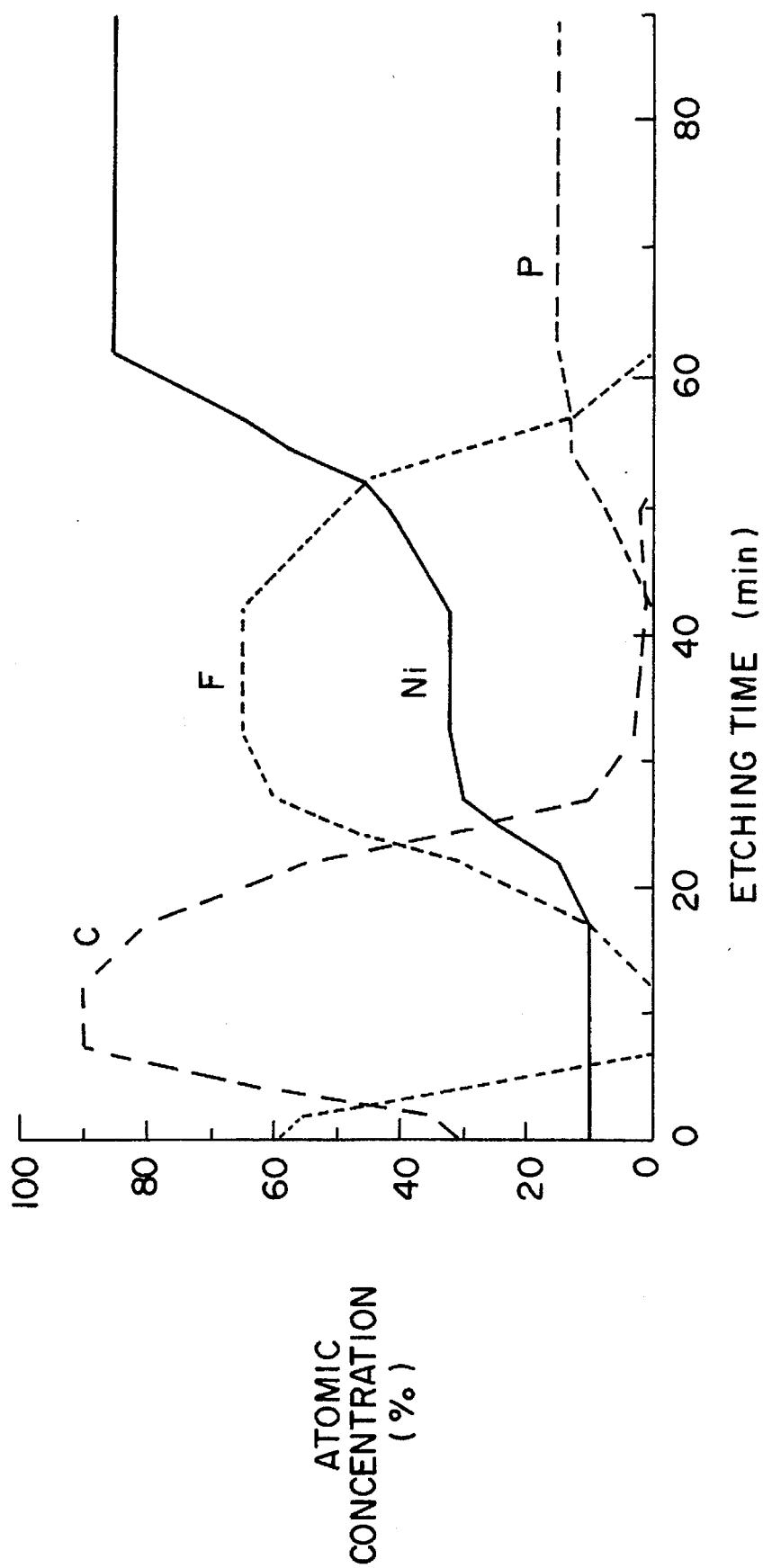
FIG. 9 is an ESCA depth chart of a material of Example 4.

A sample having nickel fluoride on the surface (the same as the sample of Reference Example 1) was subjected to a carbon treatment with propane gas at 350° C. for 1 hour, further fluorinated with fluorine gas at 150° C. for 1 hour and heat-treated in an inert gas at 350° C. for 2 hours. FIG. 9 shows an ESCA depth chart of the resulting sample. A multilayer film was formed which was composed of a fluorocarbon film, carbon film, nickel fluoride film and substrate metal.

Example 5

Samples were immersed in a 50% aqueous solution of HF, which has great corrosive and penetrating properties, at 25° C. for 5 hours and checked for corrosion resistance. Table 3 shows the result. The samples used for testing were different in bonds contained therein (that is, treated at different temperatures listed in Table 3 for 2 hours for the fluorination of carbon surface). Toward the right in Table 3, fluorination proceeds with an increase in the amount of $CF_3$ bonds.

Despite the state of bonds, no corrosion occurred, and the surface formed by fluorocarbon was found outstanding in corrosion resistance.

TABLE 3

| Fluorination temperature | 100° C. | 125° C. | 150° C. | 175° C. | 200° C. |
|---|---|---|---|---|---|
| Proportions of bonds | $CF>CF_2>CF_3$ | $CF=CF_2>CF_3$ | $CF_2>CF_3>CF$ | $CF_2=CF_3CF$ | $CF_3>CF_2>CF$ |
| Corrosion | No | No | No | No | No |

Example 6

Figure 10:
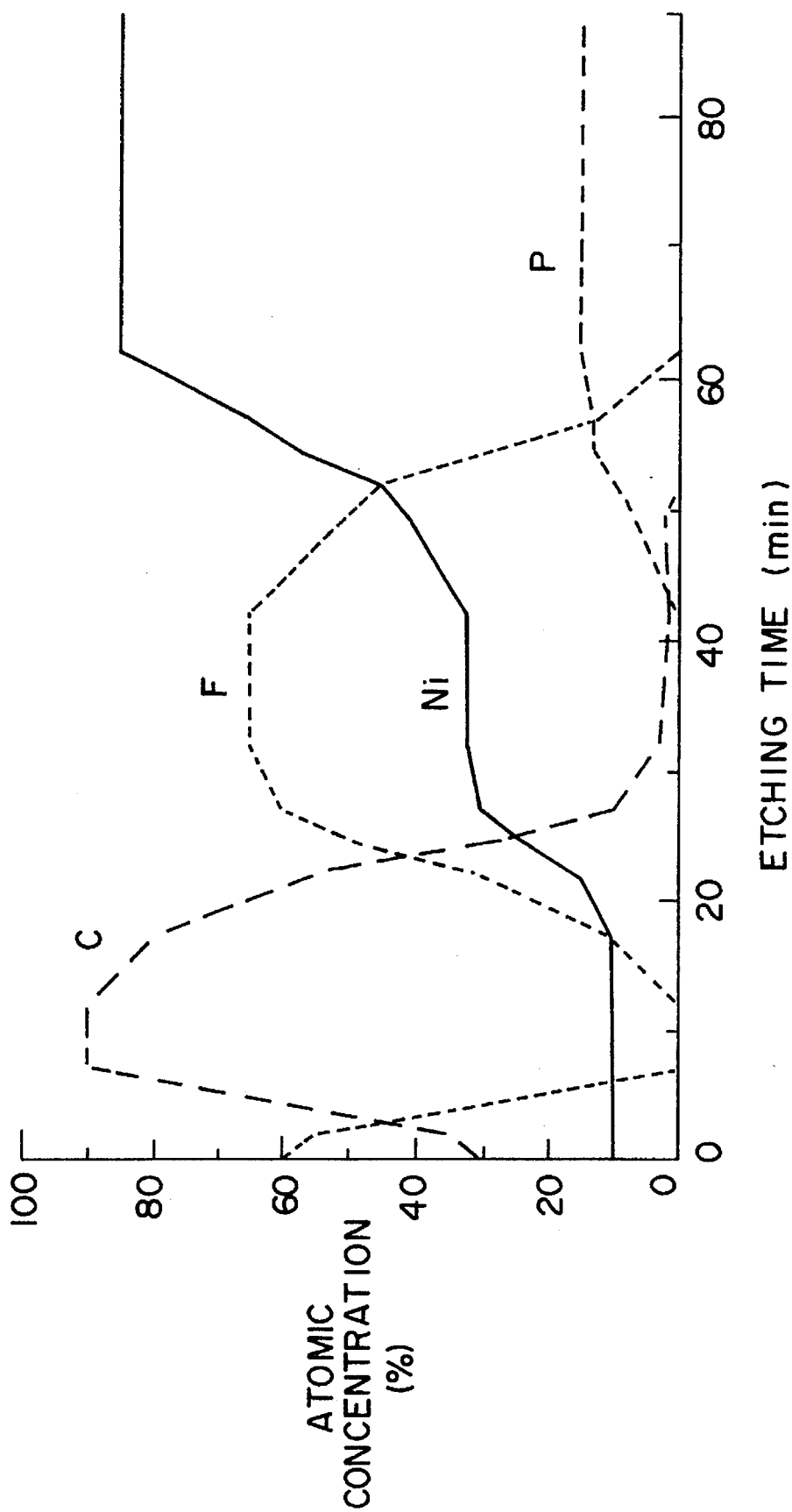
FIG. 10 is an ESCA depth chart of a material of Example 6.

The sample having the fluorocarbon film formed in Example 4 was allowed to stand in an oven at 350° C. for 5 hours and checked for heat resistance. FIG. 10 shows an ESCA chart of the tested sample. The test produced no change, indicating that the film as resistant to heat.

Example 7

Figure 11A:
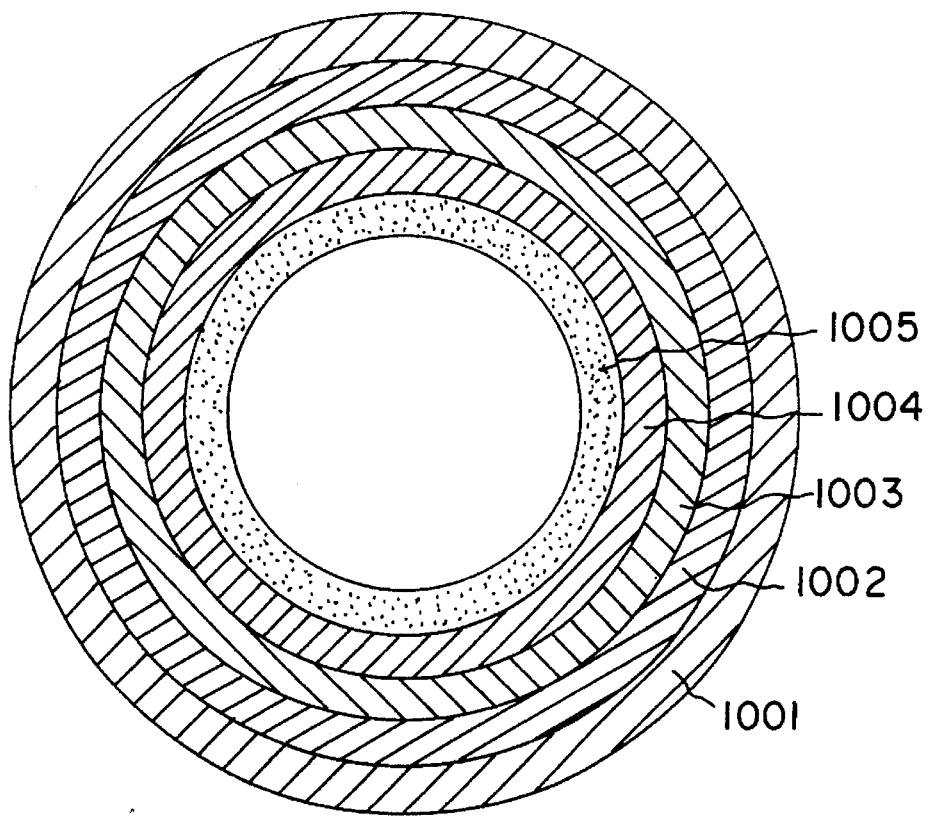
FIG. 11 is a sectional view of a chemical supply pipe.
Figure 11B:
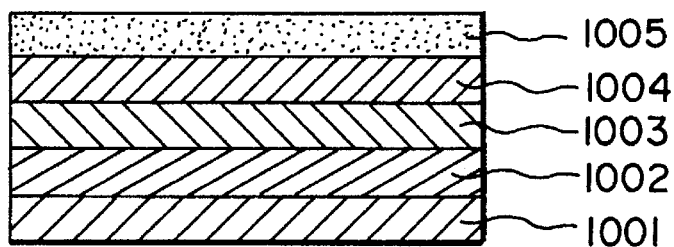

A fluorocarbon film of the present invention was formed on piping. FIG. 11 is sectional view of a chemical supply pipe. Indicated at 1001 is a stainless steel tube having an outside diameter of ½ inch used for preparing the pipe, at 1002 a nickel-phosphorus plating (10 micrometer), at 1003 a nickel fluoride film (1500 angstroms), at 1004 a carbon layer (2000 angstroms) and at 1005 the fluorocarbon film (100 angstroms).

Since the metal tube can be subjected to the fluorocarbon treatment, the resulting pipe had a higher strength than resin pipes. Although lined tubes can not be treated conventionally unless they have a large diameter, the tubes of small diameter can be treated according to the invention.

Example 8

After treating to remove an oil and washing, a nickel plate was reacted with propane gas at 350° C. for 1 hour to form carbon films.

Figure 12:
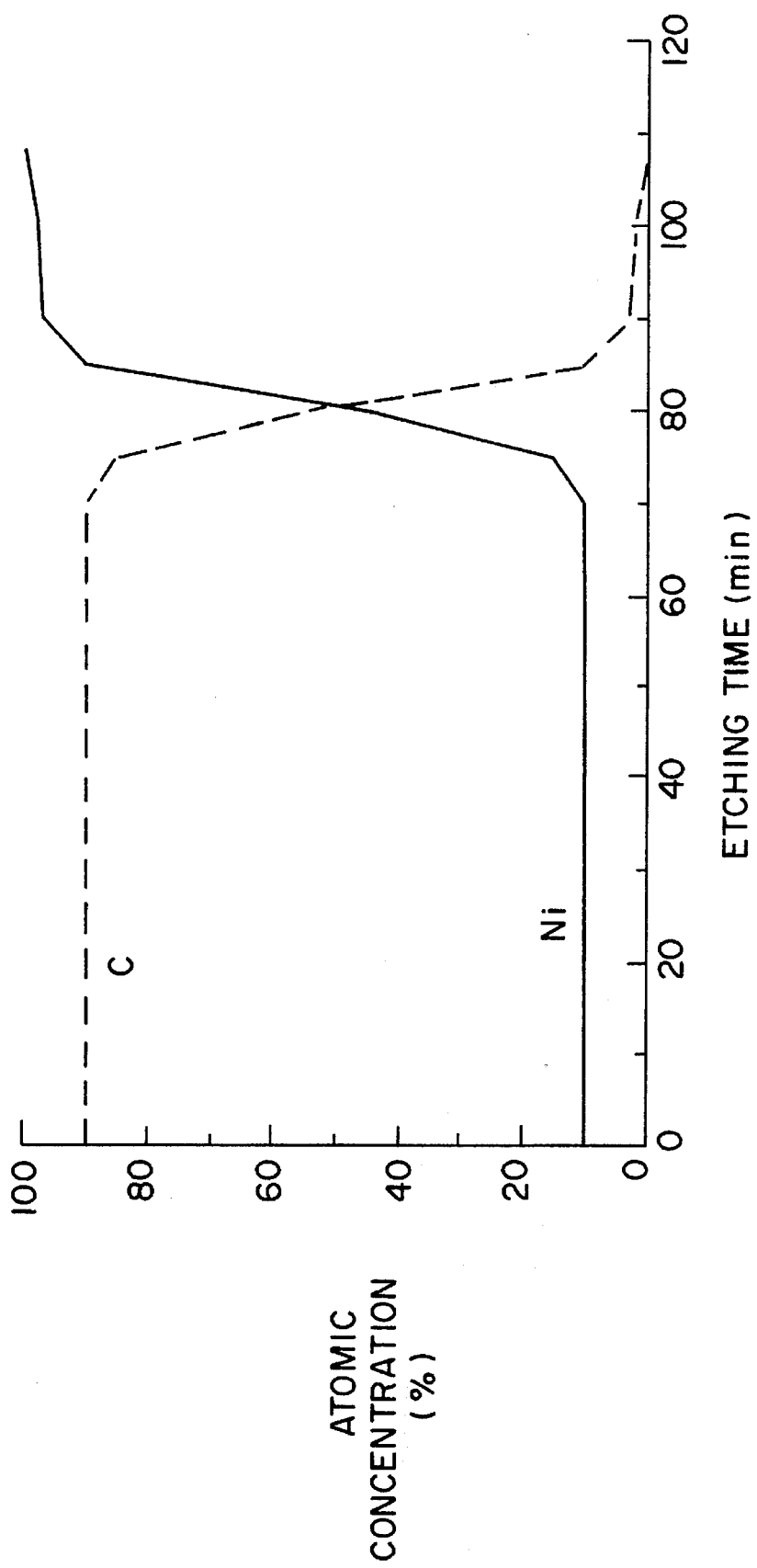
FIG. 12 is an ESCA depth chart of a material of Example 8.

The thickness of the carbon layer was measured by ESCA with the result given in FIG. 12. It is found that the carbon layer is formed on the nickel plate.

Example 9

After treating to remove an oil and washed, a nickel plate was reacted with propane gas at 350° C. for 1 hour, followed by fluorination in 100% $F_2$ at 200° C. for 1 hour and further by a heat-treatment in a nitrogen atmosphere at 350° C. for 2 hours.

Figure 13:
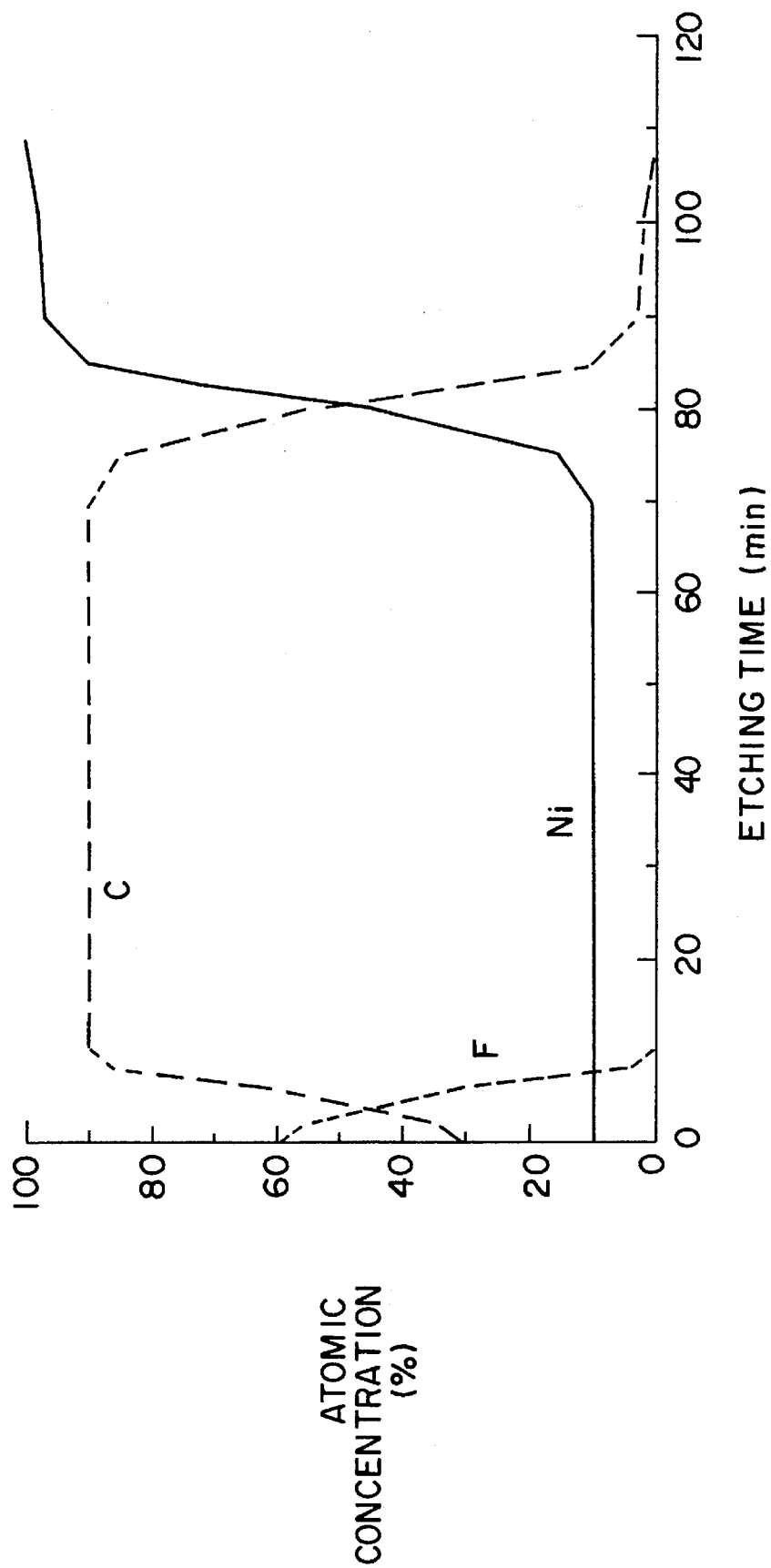
FIG. 13 is an ESCA depth chart of a material of Example 13.

The thickness of the carbon layer and fluorocarbon layer were measured by ESCA with the result given in FIG. 13. It is found that the carbon layer and fluorocarbon layer are formed on the nickel plate.

The fluorocarbon film formed by the present invention has remarkable corrosion resistance to aqueous HF solutions exhibiting strong dissolving properties. The metal materials formed with the fluorocarbon film are expected to have a great advantage for use in the semiconductor wet process. Although the apparatus wherein resins are used and which are conventionally employed for the wet process still remain to be improved in heat resistance and strength and are not usable, for example, at high temperatures or in a vacuum, the apparatus embodying the invention is usable under such conditions.

What is claimed is:

1. A metal material comprising a substrate metal, a first film comprising a nickel fluoride layer and formed on the substrate metal, said first film having a thickness of 100 Å to 1 micrometer, and a second film comprising a carbon layer and formed on said first film, said second film having a thickness of 10 Å to 1 micrometer.

2. A metal material comprising a substrate metal, a first film comprising a nickel fluoride layer and formed on the substrate metal, said first film having a thickness of 100 Å to 1 micrometer, a second film comprising a carbon layer and formed on said first film, said second film having a thickness of 10 Å to 1 micrometer, and a third film comprising a fluorocarbon layer and formed on said second film, said third film having a thickness of 10 Å to 5000 Å.

3. A metal material comprising a substrate metal, a first film comprising a carbon layer and formed on the substrate metal, said first film having a thickness of 100 Å to 1 micrometer, and a second film comprising a fluorocarbon layer and formed on said first film, said second film having a thickness of 10 Å to 5000 Å.

\* \* \* \* \*